United States Patent
Giesler

(10) Patent No.: US 6,424,029 B1
(45) Date of Patent: Jul. 23, 2002

(54) CHIP CARD

(75) Inventor: Thomas Giesler, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/688,642

(22) Filed: Oct. 16, 2000

(30) Foreign Application Priority Data

Oct. 20, 1999 (DE) .......................................... 199 50 524

(51) Int. Cl.[7] .......................... H01L 23/02; H05K 1/14; B23P 19/00
(52) U.S. Cl. .................... 257/679; 361/784; 29/840; 29/827; 29/846; 235/488; 235/492
(58) Field of Search ..................... 257/679; 361/784; 29/840, 827, 846; 235/488, 492

(56) References Cited

U.S. PATENT DOCUMENTS 5,773,812 A  *  6/1998  Kreft

FOREIGN PATENT DOCUMENTS

| DE | 4205556 C2 | | 8/1993 | |
|---|---|---|---|---|
| DE | 197 43 303 A1 | * | 4/1999 | .................. 235/492 |
| FR | 2728710 | | 6/1996 | ......... G06K/19/073 |
| WO | WO 95/22121 | * | 1/1995 | .................. 235/492 |
| WO | WO 99/16019 | * | 9/1997 | .................. 235/492 |
| WO | WO9820450 | | 5/1998 | ......... G06K/19/077 |

* cited by examiner

*Primary Examiner*—Jasmine J B Clark
(74) *Attorney, Agent, or Firm*—Daniel J. Piotrowski

(57) ABSTRACT

A chip card is described, preferably a contactless chip card, comprising a data-processing circuit for receiving, processing and/or transmitting data signals, and at least a capacitive switching element which can be activated by means of a user's touch, whose activation of the switching element triggers at least the transmission of data signals from the data-processing circuit and without whose activation at least the transmission of data signals from the data-processing circuit is prevented. This chip card is formed in such a way that an arrangement is obtained with little manufacturing effort, ensuring a reliable activation or deactivation of the chip card by the user.

6 Claims, 3 Drawing Sheets

CHIP CARD

BACKGROUND OF THE INVENTION

The invention relates to a chip card, preferably a contactless chip card.

DE 42 05 556 C2 discloses a chip card with electronic elements for a contact-free exchange of data by means of electromagnetic alternating fields, using an external apparatus. The chip card incorporates one or more switches which can be manually operated and allow the electronics or parts of the electronics to be manually switched on or off so as to release data and characteristics of the chip card only in accordance with the options of the user of the chip card. This should render the unauthorized identification of the chip card more difficult. In addition to a definitive blocking of the chip card, the activation of this card by the switches in the plastic card is possible in emergency situations. The switches, embedded in the card material, may be formed as toggle switches in that two recognizable marks on the upper surface of the card disclose the switching position.

Such a mechanical switch is, however, very elaborate from a manufacturing point of view and, in operation, it is sensitive to disturbances.

The international publication WO 98/20450 discloses an identification card with a transaction coil and a method of manufacturing this card. The transaction coil is formed as a silver or generally conductive paste silk screen component which is incorporated in a plastic card body corresponding to the conventional ISO standards and whose ends are subsequently bared by means of a milling process for implanting a special chip module, or whose contact ends have already been kept free in a lamination or injection-molding process, and whose contacting can only be realized by intentionally exerting pressure and becomes automatically inactive after ending this pressure.

Such a touchlessly functioning identification card should provide the possibility of intentionally bringing about the process of identification and transaction of data. The deliberate switching of a transponder coil is essential in this case. However, this identification card is also very elaborate as regards its manufacture and, in operation, it is sensitive to disturbances.

An electronic card with a function which can be manually activated is known from FR 2,728,710-A1. This electronic card has a plastic body which comprises the function components that are fed from the battery. The battery is connected to a sensor whose physical properties vary due to its manual operation. An electronic circuit monitors the operation of the function components independently of the state of the sensor. A resistance strain gauge may be used as a sensor which reacts to bending of the card, or a thermistor may be used which responds to the warmth of a user's finger touching the card. The sensor may also comprise pairs of electrodes between which the resistance changes upon a user's touch. For a reliable operation, the function components should only be activated when the rate of change of the physical property detected by the sensor is within a predetermined range.

Such sensors have proved to be unreliable. For example, the responses of a thermistor or a thermoelement or the resistor between two electrodes may be dependent on the temperature of the user's finger or on the fact whether the user wears gloves.

SUMMARY OF THE INVENTION

It is an object of the invention to form a chip card in such a way that an arrangement is obtained with little manufacturing effort, ensuring a reliable activation or deactivation of the chip card by the user.

According to the invention, this object is solved by a chip card, preferably a contactless chip card, comprising a data-processing circuit for receiving, processing and/or transmitting data signals, and at least a capacitive switching element which can be activated by means of a user's touch, whose activation of the switching element triggers at least the transmission of data signals from the data-processing circuit and without whose activation at least the transmission of data signals from the data-processing circuit is prevented.

A cost-efficient, reliable switching possibility is provided by forming capacitive switching elements for activating or deactivating the chip card. A chip card thus formed is robust and suitable for high-stress use. Erroneous activation by, for example, forgetting a switch in an unwanted switching position is excluded. The capacitive switching elements used in accordance with the invention are insensitive to dirt, oxidation, humidity or to the user wearing gloves. The capacitive switching elements formed in accordance with the invention can be manufactured at minimal cost and with a minor additional manufacturing effort. The switching elements formed in accordance with the invention are not subject to any mechanical wear. Inadvertent activation as well as unintentionally leaving the chip card in an unwanted switching state is also excluded. The building depth is very small and is therefore preferably suitable for chip cards. The manufacture may be performed within the required steps of manufacturing the card. No additional process steps are required in the manufacturing process. There is only a minor increase of the number of components on the chip card.

A preferred further embodiment of the chip card according to the invention has two capacitive switching elements which comprise touch zones formed with conductor structures, which with respect to their capacitance can be changed by means of a touch, and an associated evaluation circuit for detecting capacitance changes. Such conductor structures can be easily formed in a printed circuit board technique. The conductor structures should not be positioned unprotected on the upper surface of the chip card but may also be provided with a dirt-repelling and corrosion-resistant or destruction-inhibiting coating. However, when a mechanically unprotected arrangement of these conductor structures is chosen, its reliability of operation is not or at least not directly affected by dirt or corrosion. The conductor structures may also be arranged in a concealed form on the chip card so that the, for example, graphic configuration of the touch zones can be freely realized. This may simplify the ease of handling by the user.

Preferably, each conductor structure comprises at least two plane, interdigitally intertwined conductor configurations. Each conductor configuration is assigned to a row of strip-shaped conductor sections connected together in a conducting manner. Preferably, a conductor section of a first conductor configuration and a conductor section of a second conductor configuration are alternately situated substantially parallel to each other. An increase of the capacitance of the capacitive switching element is thereby achieved, and a larger change of this capacitance is realized upon a user's touch. This alleviates the reliable detection of an operation.

In each conductor structure described hereinbefore, a first one of the conductor configurations constitutes an energizing electrode and the associated second one of the conductor configurations constitutes the relevant conductor structure of a measuring electrode. Each energizing electrode of the two capacitive switching elements is connected to one of the terminals of an antenna coil arranged on the chip card and used for the wireless transmission of the data signals. The energizing electrodes are thus directly fed by the electromagnetic field generated by or received from the antenna coil. A corresponding alternating voltage, which can be detected and processed in a simple way, is impressed on the measuring electrodes of the switching elements via the capacitances formed by the conductor structures. By touching the conductor structures in the touch zones, the capacitance of optionally one of the conductor structures can be changed. This change is also easily detectable and leads to a corresponding recognition of the user's touch and hence the command given by this user. Moreover, combinations of touches of the touch zones are feasible. For said evaluations, the measuring electrodes are coupled to the evaluation circuit.

In a further embodiment of the invention, the measuring electrodes are constituted by a common conductor arrangement overlapping the two touch zones and comprising the corresponding conductor configurations. By virtue of such a conductor arrangement, the implementation of the measuring electrode as a common conductor structure and hence the process of manufacturing of the chip card is simplified.

For a simplified manufacture of a chip card of the type according to the invention, the switching element(s) together with the data-processing circuit is (are) arranged on a common supporting element. Preferably, the arrangement on this common supporting element also comprises terminals for the previously mentioned antenna coil. The supporting element with the elements arranged thereon may then be pre-manufactured as a module which, in a final manufacturing step, can be composed, for example, welded together with the antenna coil and possible further components of the chip card in the body of the card.

These and other aspects of the invention are apparent from and will be elucidated with reference to the embodiments described hereinafter.

DESCRIPTION OF THE PREFERRED EMBODIMENTS

Figure 1:
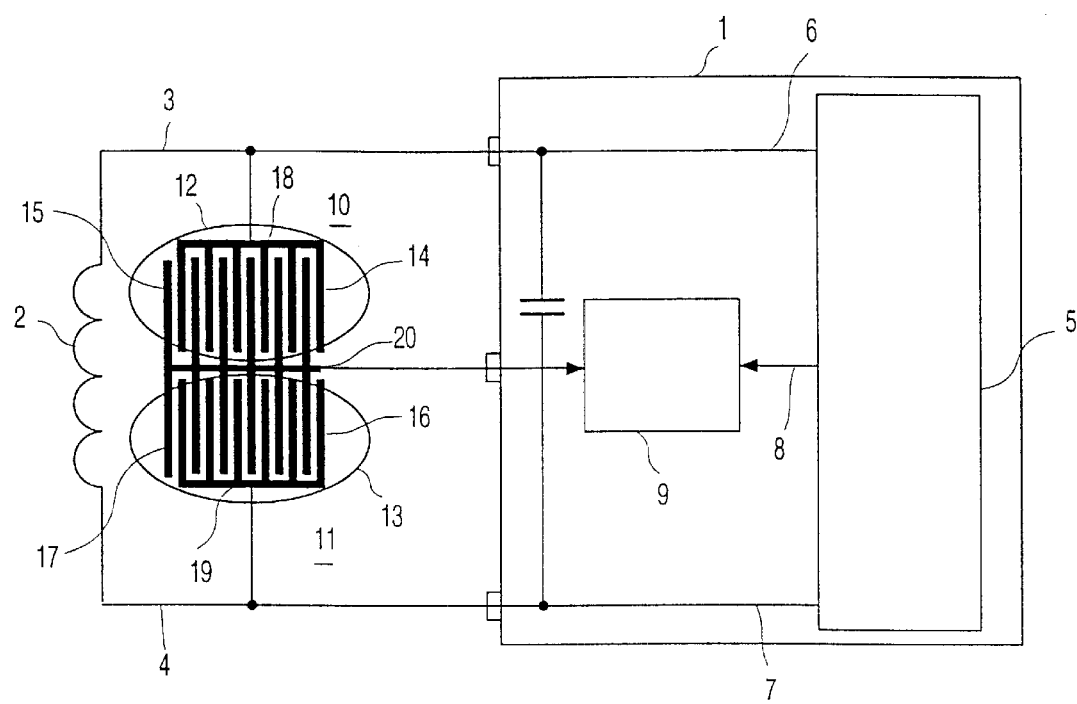
FIG. 1 is a circuit diagram of a chip card according to the invention.

In the circuit arrangement in FIG. 1, showing the block-diagrammatical structure of an embodiment of an electronic device for a chip card, preferably a smart card, the reference numeral 1 denotes a data-processing circuit adapted to receive, process and/or transmit data signals in a contactless way via an antenna coil 2. To this end, the antenna coil 2 is connected to two terminals 3, 4 of the data-processing circuit 1. In a block 5, the dataprocessing circuit 1 comprises the known devices for receiving, processing and/or transmitting the data signals, as well as a power supply and clock-processing facility. It is connected to the terminals 3 and 4 of the antenna coil 2 via terminals 6 and 7, respectively. A further terminal 8 of the block 5 for supplying a clock signal is connected to an evaluation circuit 9.

The electronic circuit of the chip card in accordance with the embodiment shown in FIG. 1 comprises two capacitive switching elements including two conductor structures 10, 11 in addition to the evaluation circuit 9. Each conductor structure 10, 11 is at least substantially arranged within an assigned touch zone 12, 13, respectively. Each conductor structure 10, 11 has two plane, interdigitally intertwined conductor configurations 14, 15 and 16, 17, respectively. Each conductor configuration 14 to 17 consists of strip-shaped conductor sections whose common terminals 18, 19 and 20 are connected in a conducting manner with respect to the relevant conductor configuration. The conductor configuration 14, whose common terminal 18 is connected to the terminal 3 of the antenna coil 2, constitutes an energizing electrode within the touch zone 12. In a corresponding manner, the conductor configuration 16 within the touch zone 13 constitutes an energizing electrode for said touch zone 13 by means of its common terminal 19 connected to the terminal 4 of the antenna coil 2. The conductor configurations 15, 17 constitute measuring electrodes of the associated conductor structures with respect to the corresponding touch zones 12 and 13. Moreover, in FIG. 1, the measuring electrodes 15, 17 are constituted by a common conductor arrangement overlapping the two touch zones. Their common terminal 20 is coupled to the evaluation circuit 9.

The evaluation circuit 9 comprises, for example, a detection arrangement for detecting a minimum of the amplitude of a signal supplied through the common terminal 20, as well as a phase comparator. When the circuit arrangement shown in FIG. 1 is operative, the switching elements are impressed with a high-frequency alternating voltage by the antenna coil 2. The conductor configurations 14, 15 and 16, 17 have the function of capacitances and constitute a capacitive voltage divider whose tap constitutes the common terminal 20. The alternating voltage taken, in operation, from this common terminal 20 is applied to the evaluation circuit 9.

Figure 2:
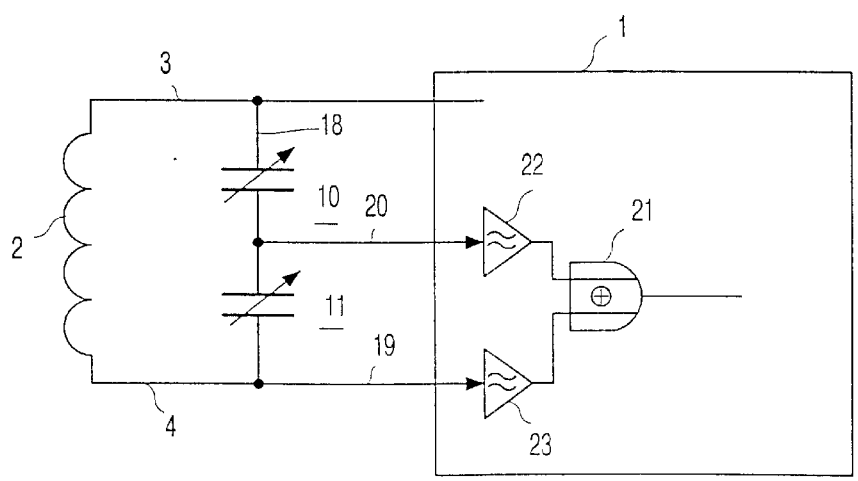
FIG. 2 is a circuit diagram showing the mode of operation of the switching elements of the chip card according to the invention.

To elucidate the mode of functioning of the capacitive voltage divider described hereinbefore, FIG. 2 shows the components required for this divider in a circuit diagram, and the conductor structures 10, 11 constitute two capacitances which can be changed by touching the touch zones 12 and 13, respectively. The change of the capacitances is achieved by changing the dielectricity constant which occurs when a user touches the relevant touch zone 12 or 13, for example, by means of a fingertip. The amplitude of the signal at the common terminal 20 of the conductor structures 10, 11 is thereby increased. The phase position of this signal also changes, namely dependent on which of the two touch zones 12, 13 has been touched, i.e. which of the conductor structures 10 or 11 has changed its capacitance. The capacitive voltage divider constituted by the conductor structures 10, 11 precedes a circuit arrangement which is comprised by the evaluation circuit 9 and is used for detecting the amplitude change as well as the phase change of the signal at the common terminal 20. FIG. 2 shows a simple embodiment for a phase detector which is formed with an exclusive-OR gate 21. In FIG. 2, this exclusive-OR gate is connected by means of its input terminals to the common terminals 20 and 19 via alternating voltage amplifiers 22 and 23, respectively. Phase information and hence information about the selection, i.e. touch of the touch zones 12 and 13 by the user can be gained at the output terminal of the exclusive-OR gate 21. As elucidated hereinbefore, each touch zone 12 and 13 can be graphically formed, for example, as marks having different colors or text marks.

Instead of a phase detection in the evaluation circuit 9, only an amplitude detection may be optionally performed. This is sufficient when only a touch of one of the touch zones 12 or 13 is to be detected as such and when no distinction is to be made. In this case, one of the touch zones 12 or 13 may be dispensed with or replaced by a capacitor with a fixed capacitance.

In the dimensioning of the conductor structures 10, 11 it is to be noted that a touch of the touch zones 12, 13 does not give the capacitances of the conductor structures 10 and 11 such an influence that a resonant circuit formed on the chip card to receive or transmit data signals is not detuned in an unwanted manner.

The arrangement described only requires an additional terminal for the data-processing circuit 1, which terminal is connected to the common terminal 20 for connection to the evaluation circuit 9. This simplifies the construction of an integrated circuit in which the data-processing circuit 1 is incorporated.

A very simple and uniform manipulation of the chip card of FIG. 1 is possible, with which also a menu can be controlled. The chip card may be held in one hand and the touch zones 12 and 13 may be preferably touched with the thumb of the same hand. The transmission of the data signals between the chip card and a reader may be menu-controlled via the chip card according to the invention in an operating program run on the reader. Additional security mechanisms against erroneous operations may be used within such menu-controlled program runs.

Figure 3:
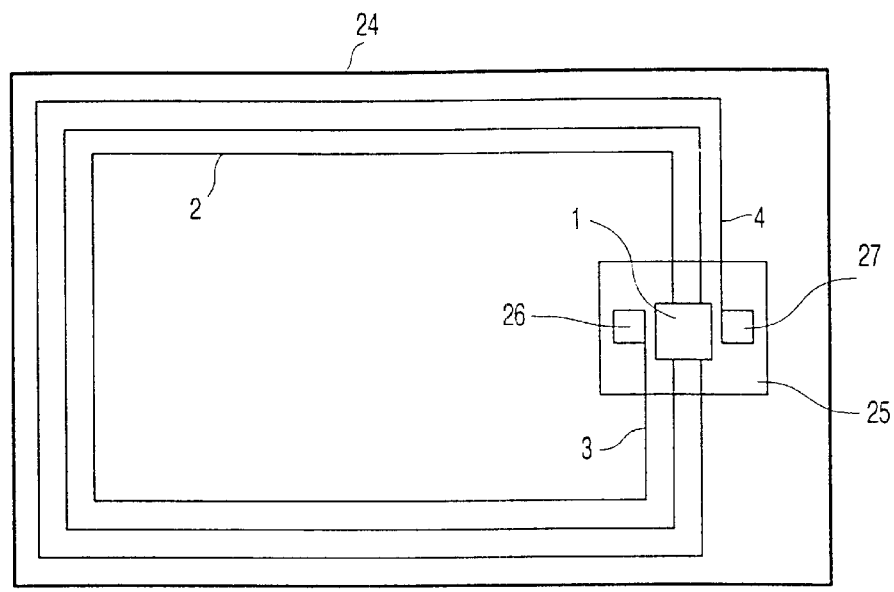
FIGS. 3 to 5 show embodiments of forming the conductor structures on a chip card according to the invention.

FIG. 3 shows diagrammatically the card body 24 of a chip card according to the invention, comprising the antenna coil 2 which has three turns in the embodiment shown, whose ends—the terminals 3 and 4—are electrically connected to a common supporting element 25 by means of two terminal areas 26 and 27, respectively. Particularly, the antenna coil 2 (not shown in detail in FIG. 3) may be formed with its own terminal areas arranged congruently with the terminal areas 26, 27 after assembly, which terminal areas are directly arranged on the card body 24 and are preferably manufactured in the same manufacturing step together with the terminals 3, 4 and the conductor of the turns of the antenna coil 2. When the supporting element 25 is placed on the card body 24, this is done in such a way that the terminal areas 26, 27 on the supporting element 25 are adjusted congruently with said terminal areas which are connected to the terminals 3 and 4. The terminal areas of the terminals 3 and 4 are then connected to the terminal areas 26, 27 of the supporting element 25 by means of, for example, a soldering operation.

Moreover, the supporting element 25 is provided with the data-processing circuit 1 which also comprises the evaluation circuit 9 and is connected to the terminal areas 26, 27 of the supporting element 25 by the conductors arranged on the supporting element 25. In this way, the supporting element 25 provided with components, on the one hand, and the card body 24 provided with the antenna coil 2 and its terminal areas, on the other hand, may be separately manufactured and mounted as separate components, and may subsequently be welded, for example, jointly in a protective foil.

Figure 4:
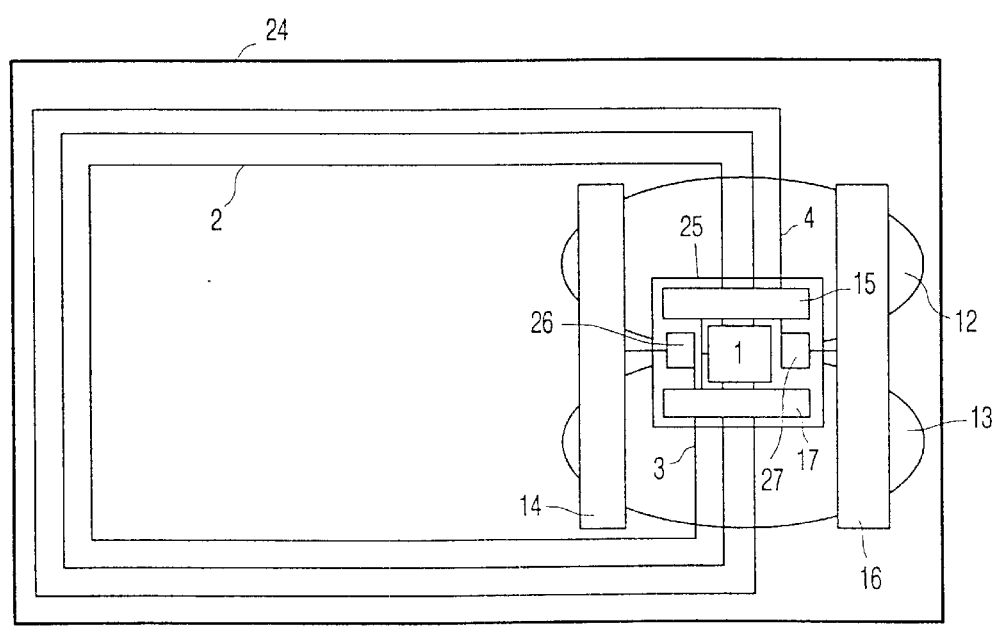

To arrange the conductor configurations in accordance with the invention for the switching elements with a minimal number of additional components in such a standard configuration for a contactless chip card, for example, an arrangement as shown in FIG. 4 is chosen. In this arrangement, elements corresponding to those of the arrangement shown in FIG. 3 are denoted by the same reference numerals. In addition to the antenna coil 2 with its terminals 3, 4, the two energizing electrodes 14 and 16 are arranged on the card body 24. This is effected in the same manufacturing step as for the arrangement of the antenna coil 2 with its terminals 3, 4. On the other hand, the measuring electrodes 15, 17 are provided on the supporting element 25 in the same manufacturing step as in the manufacture of the terminal areas 26, 27. This is effected jointly with the manufacture of the common terminal 20. When mounting the data-processing circuit 1 (integrated circuit) on the supporting element 25, the connection between the evaluation circuit 9 and the common terminal 20 is then also established. The supporting element 25 can then be mounted in the same way on the card body 24 as for the conventional chip card shown in FIG. 3. Moreover, the mechanical stress capability of the card body 24 is maintained by this simple arrangement, which capability would decrease if the number of terminal areas were increased.

Figure 5:
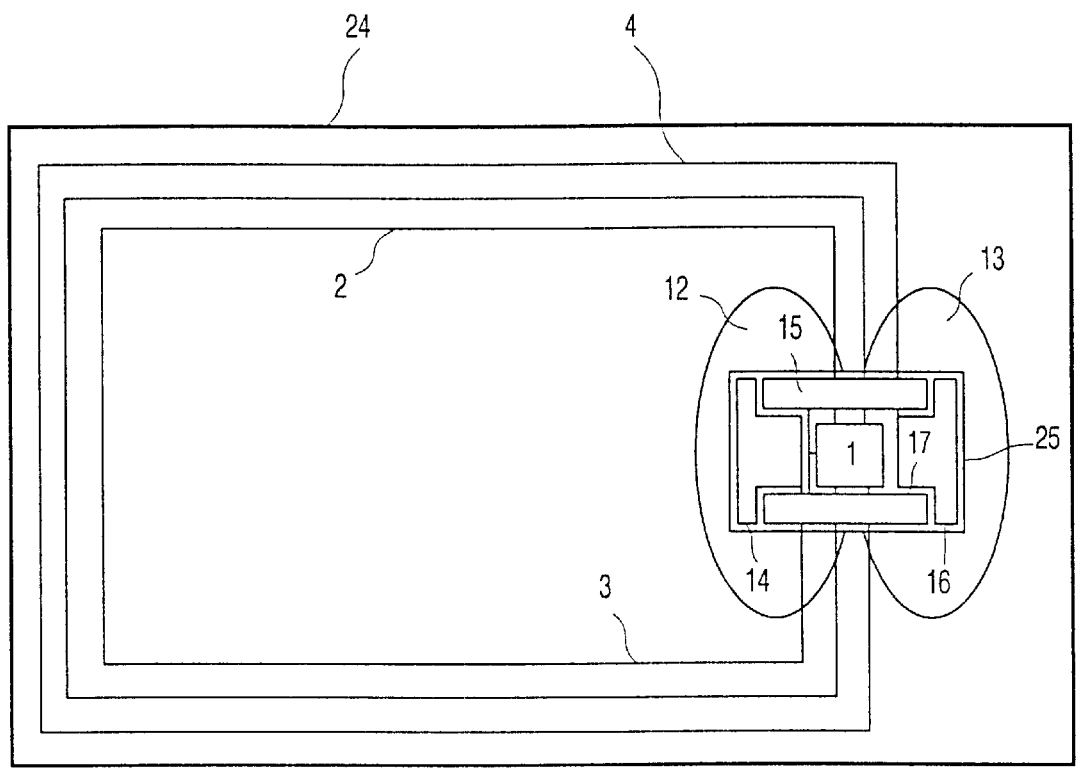

In a further embodiment shown in FIG. 5, both the energizing electrodes 14, 16 and the measuring electrodes 15, 17 are jointly arranged on the supporting element 25. This simplifies the arrangement of the conductors on the card body 24, so that further simplifications in the manufacturing process can be realized. Particularly, the card body 24 can be uniformly manufactured for conventional chip cards and for chip cards according to the invention. Also the connections between the supporting element 25 and the card body 24 are unchanged as compared with a conventional chip card without switching elements.

The effect of the energizing electrodes 14, 16 is further increased in the previously described arrangements by a stray capacitance of the turns of the antenna coil 2.

The advantage of great ease of fabrication is achieved with the chip card formed in accordance with the invention. The switching elements formed in accordance with the invention are mechanically robust and suitable for a long period of operation because no movable parts such as, for example, mechanical switches are required. The card has a high reliability of operation, also when the user wears gloves. Unwanted activation can easily be prevented by the implementation of special program runs. The switching elements according to the invention do not increase the thickness of the card body. The manufacturing steps required for manufacturing the switching elements according to the invention on the chip card can be combined with the manufacturing steps which are necessary anyway and can be performed within their framework without additional components; particularly a manufacture using the same manufacturing steps is possible. Additional components outside the dataprocessing circuit are not required. This allows manufacture at very low cost. The chip card can be manipulated with one hand in a very easy and uniform manner and provides the possibility of a wireless, menu-controlled communication with a reader. Moreover, its use for combicards, i.e. chip cards with contactless and contact transmission is also possible.

What is claimed is:

1. A chip card, preferably a contactless chip card, comprising a data-processing circuit for receiving, processing and/or transmitting data signals, and at least a capacitive switching element which can be activated by means of a user's touch, whose activation of the switching element triggers at least the transmission of data signals from the data-processing circuit and without whose activation at least the transmission of data signals from the data-processing circuit is prevented, wherein two capacitive switching elements which comprise touch zones formed with conductor structures, which with respect to their capacitance can be changed by means of a touch, and an associated evaluation circuit for detecting capacitance changes.

2. A chip card as claimed in claim 1, wherein the switching element(s) together with the data-processing circuit is (are) arranged on a common supporting element.

3. A chip card as claimed in claim 1, wherein each conductor structure comprises at least two plane, interdigitally intertwined conductor configurations.

4. A chip card as claimed in claim 3, wherein a first one of the conductor configurations of each conductor structure constitutes an energizing electrode and the second one of the conductor configurations of each conductor structure constitutes a measuring electrode, and in that each energizing electrode is connected to a terminal of an antenna coil arranged on the chip card and used for transmitting the data signals.

5. A chip card as claimed in claim 4, wherein the measuring electrodes are coupled to the evaluation circuit.

6. A chip card as claimed in claim 4, wherein the measuring electrodes are constituted by a common conductor arrangement overlapping the two touch zones and comprising the corresponding conductor configurations.

* * * * *